(12) United States Patent
Nin

(10) Patent No.: US 6,828,071 B2
(45) Date of Patent: Dec. 7, 2004

(54) METHOD OF ALIGNING A WAFER AND MASKS

(75) Inventor: Shu-Liang Nin, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 157 days.

(21) Appl. No.: 10/191,724

(22) Filed: Jul. 8, 2002

(65) Prior Publication Data

US 2003/0209812 A1 Nov. 13, 2003

(30) Foreign Application Priority Data

May 10, 2002 (TW) ........................................ 91109811 A

(51) Int. Cl.$^7$ ................................................ G03F 9/00
(52) U.S. Cl. ........................................ 430/22; 430/311
(58) Field of Search ................................... 430/22, 311

(56) References Cited

U.S. PATENT DOCUMENTS 6,638,671 B2 * 10/2003 Ausschnitt et al. ........... 430/22

* cited by examiner

Primary Examiner—Christopher G. Young
(74) Attorney, Agent, or Firm—Merchant & Gould P.C.

(57) ABSTRACT

A method of aligning a wafer and masks. In the present invention, a wafer having a surface with a plurality of fields and scribe lines is provided, and an initial mask and a subsequent mask are provided. The initial mask and the subsequent mask have a first pattern and a second pattern respectively corresponding to the fields, and have a plurality of original alignment marks at the corners thereof. The first pattern is transferred to the fields and a plurality of secondary alignment marks corresponding to the original alignment marks are formed at the corners of the fields by the initial mask. An intra-field alignment is performed to transfer the second pattern to each field by aligning the original alignment marks with the secondary alignment marks at the corner of each field.

6 Claims, 5 Drawing Sheets

METHOD OF ALIGNING A WAFER AND MASKS

BACKGROUND OF THE INVENTION

1. Field of the Invention

The present invention relates in general to a method of to aligning a wafer and masks. In particular, the present invention relates to a method of aligning a wafer mask wherein alignment marks are deposited in each die area.

2. Description of the Related Art

Forming an integrated circuit on a substrate (wafer) requires a series of process steps. These process steps include the deposition and patterning of material layers such as insulating layers, polysilicon layers and metal layers. The layers are typically patterned using a photoresist layer that is patterned over the material layer by exposing the photoresist through a photomask or a reticle. The photoresist is then developed to provide the pattern. Typically, the photomask or the reticle has alignment marks that are aligned to alignment marks formed on the substrate in a previous process step. However, as the integrated circuit feature size continues to decrease to obtain increased circuit density, it has become difficult to register or align one masking level to the previous level.

As shown in FIG. 1, generally, two global alignment marks 142 and 144 are deposited on the mask 140 in the conventional alignment method, and then the alignment marks 102 and 104 are aligned with the two global alignment marks 142 and 144 by a He—Ne Laser of an exposure system 160. Next, all the fields, for example chip areas or die areas, on the wafer 100 are exposed in a step-and-repeat mariner using an optical stepper. Consequently, the wafer 100 usually has a plurality of fields (dies) divided by the scribe lines. A desired pattern 146 in the mask 140 is transferred to each corresponding field in the wafer by exposing through the lens 120, step-and-repeat.

In the above method, the global alignment marks 142 and 144 are formed on the mask 140 for aligning with the marks 102 and 104. Further, a plurality of alignment marks 148 are deposited on the intersection of scribe lines for intra-field alignment. Therefore, different patterns on each mask can be transferred to the fields in the wafer by global alignment and the intra-field alignment.

As shown in FIG. 2, the alignment marks 1031 are complete when the exposure field 103, for example a shot, is complete. Therefore, the field on the wafer can align with the masks accurately by the exposure system and then the optical stepper can transfer the pattern from the mask to each field 105 accurately. However, the alignment marks 148 on the scribe lines may be unclear or disappear entirely incomplete exposure fields at the wafer's edge regions, even if the fields form complete squares. Therefore, the fields at the wafer edge regions cannot align with the masks accurately. In this case, the optical stepper cannot transfer the pattern from the mask to each field 105 accurately. This situation is illation in FIG. 2, where all the 106A, 106B, 106C~106G at the wafer edge region may not align with the masks accurately because the alignment mark is incomplete or missing.

SUMMARY OF THE INVENTION

It is an object of the present invention to provide a method of aligning a wafer and masks. In the present invention, alignment marks are deposited at the corner of each field. Consequently, the exposure system can align the mask with each field accurately for exposure process. Furthermore, after the fields are detached by a wafer saw, the alignment marks at the corner of each field also can be used for alignment in subsequent processes, for example, bonding wire in the packing process.

In the present invention, a wafer having a surface with a plurality of fields and scribe lines is provided. An initial mask and a subsequent mask having a first pattern and a second pattern respectively corresponding to the fields are provided. The initial mask and the subsequent mask further have a plurality of original alignment marks respectively at the corners thereof corresponding to the fields. Next, the first pattern is transferred to each field and a plurality of secondary alignment marks corresponding to the original alignment marks are formed by the initial mask. Then intra-field alignment is performed by aligning the original alignment masks of the subsequent mask with the secondary alignment marks at the corner of the field to form the second pattern on each field.

DETAILED DESCRIPTION OF THE INVENTION

Figure 5:
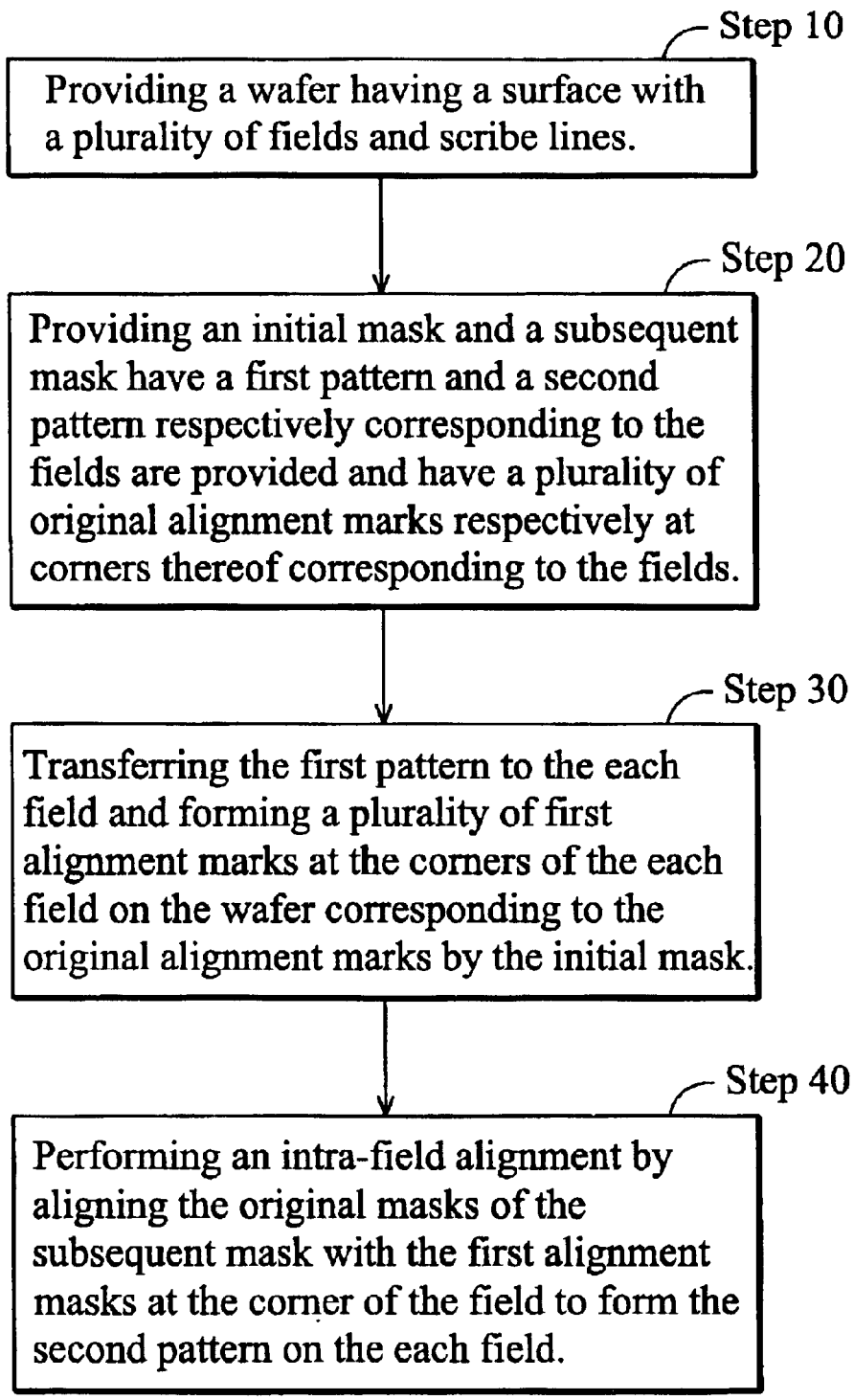
FIG. 5 shows the flow chart of the method according to the present invention.

As shown in FIG. 5, the method of aligning a wafer and masks according to the present invention comprises the steps as follows. In step 10, a wafer is provided, wherein the wafer has a plurality of scribe lines. The scribe lines divide the surface of a wafer into fields, for example die areas or chip areas. In step 20, a plurality of masks are provided, wherein each mask has a pattern corresponding to the fields and has a plurality of original alignment marks. In step 30, a first pattern is transferred to each field and a plurality of secondary alignment marks are formed at the corner of each field according to the original alignment marks of an initial mask. Then, in step 40, a second pattern is transferred to each field by aligning the original alignment marks on a subsequent mask with the plurality of secondary alignment marks at the corner of each field.

Figure 1:
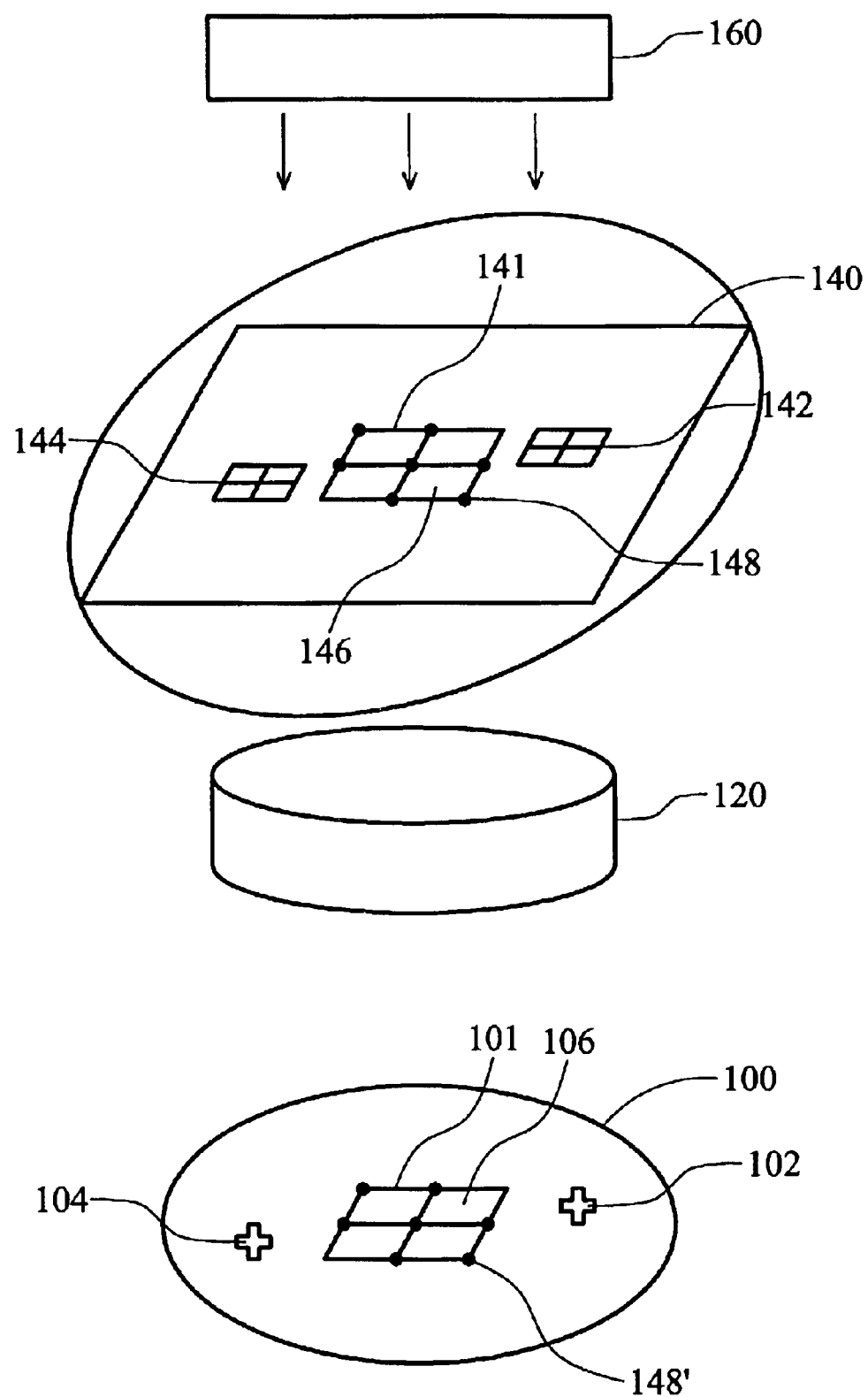
FIG. 1 is a schematic diagram of the convention alignment method.
Figure 2:
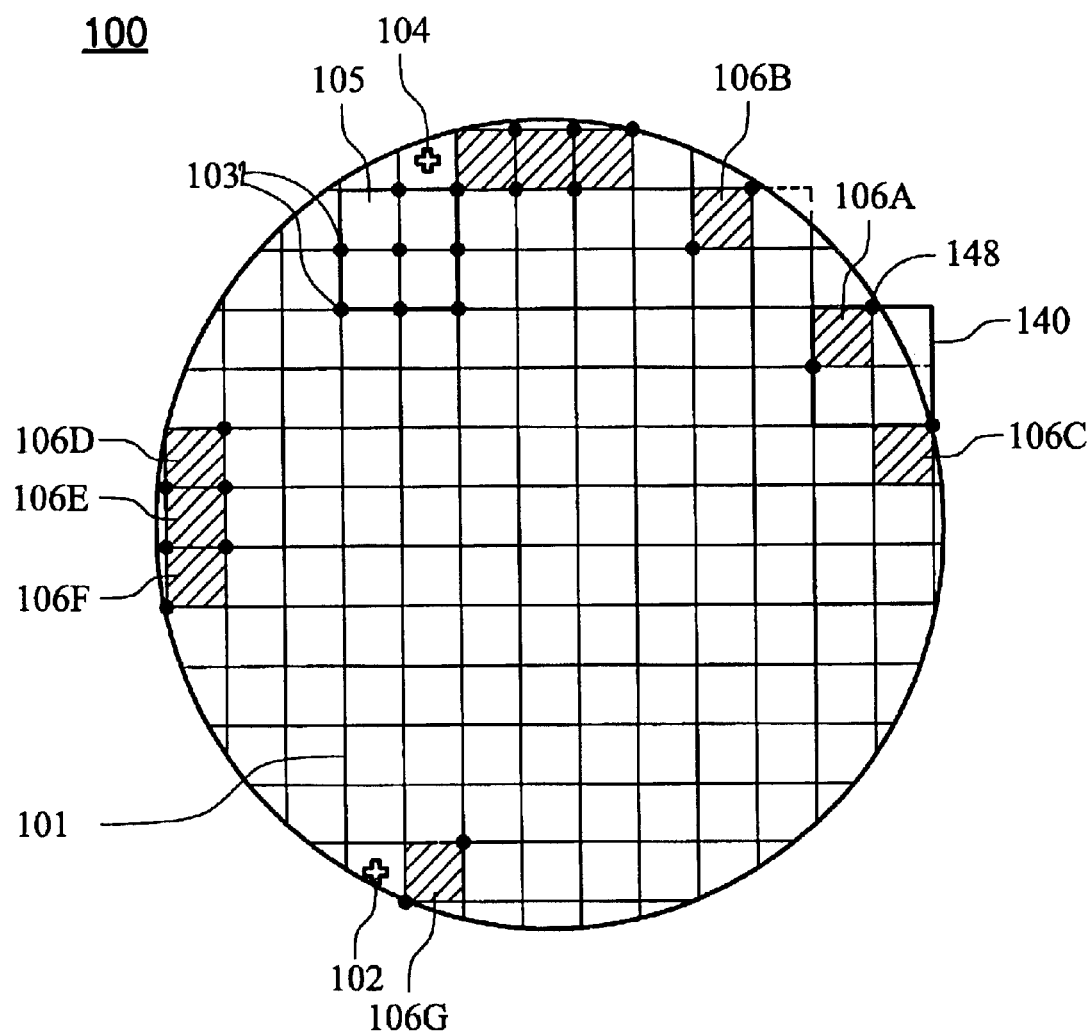
FIG. 2 is a schematic top view of a substrate global alignment marks and intra-alignment marks in the conventional method.
Figure 3:
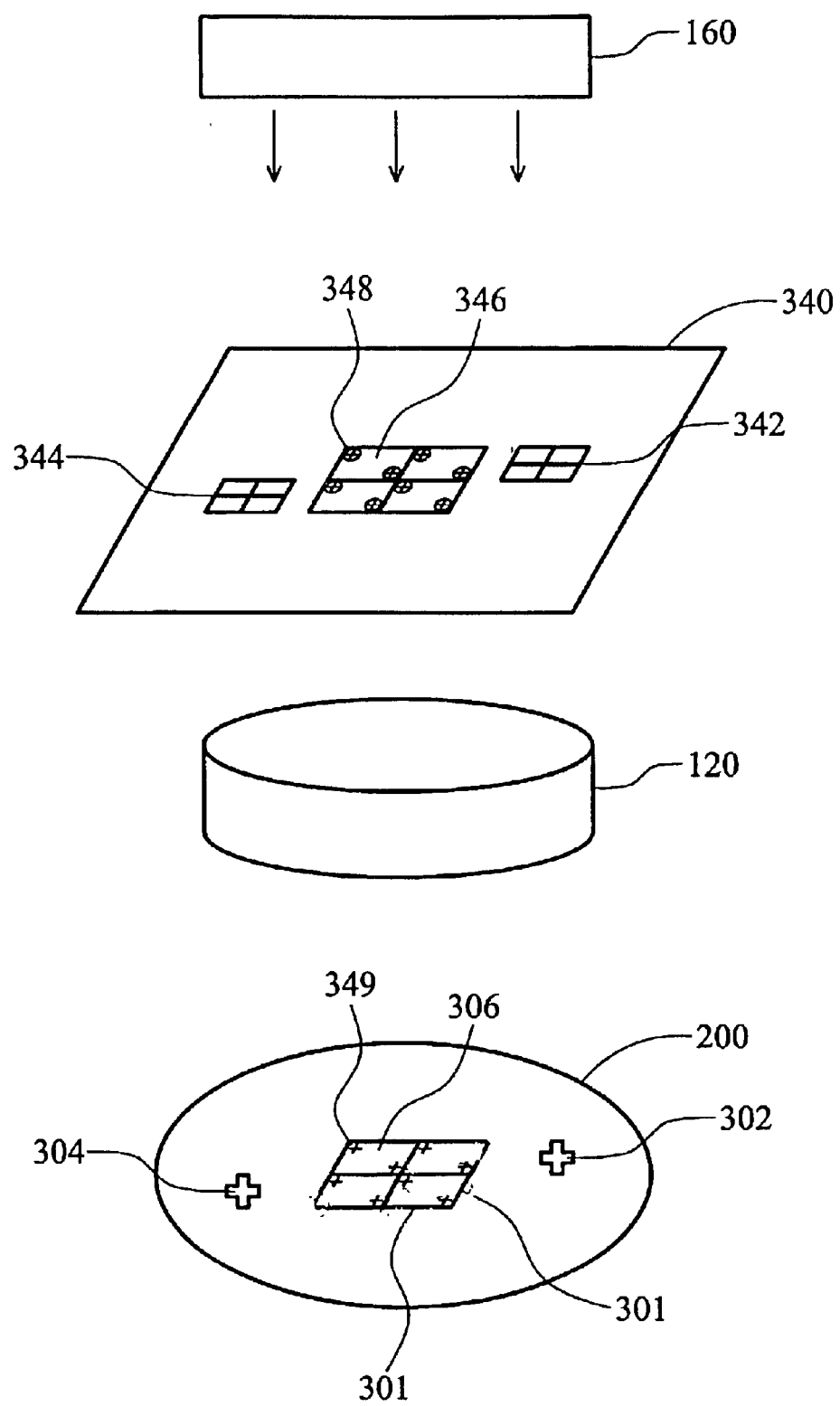
FIG. 3 shows a schematic diagram of the present invention.

As shown FIG. 3, a first pattern 346 is transferred to a field on a wafer 200 by an initial mask 340, and secondary alignment marks 349 are formed at the corner of each field 306. In this case, the secondary alignment marks 349 of each field 306 are arranged diagonally. As illustrated in FIG. 3, the alignment marks are formed inside the scribe lines 301.

In this embodiment, the surface of the wafer 200 has a plurality of fields 306, for example dies or chip regions, divided by a plurality of scribe lines 301. Further, in a photolithography exposure process, each pattern is transferred to the fields by each mask. For example, the initial mask 340 has a first pattern 346 corresponding to the field 306, and the subsequent mask 440 also has a second pattern 446 corresponding to the field 306. Further, both the initial mask 340 and the subsequent mask 440 have original alignment marks 348 and 448 corresponding to the corner positions of the fields.

Next, a first pattern (not shown) is transferred to each field 306 by the initial mask 340 aligning with the wafer 200, and secondary alignment marks 349 corresponding to the original alignment marks 348 are formed at the corner of each field 306 in the wafer 200.

For example, the global alignment marks 342 and 344 were deposited on the initial mask 340 previously and then aligned with the alignment marks 302 and 304 by He—Ne Laser of the exposure system if the photolithography exposure process is performed by an optical stepper. Consequently, the stepper then aligns the field with the initial mask 340 by the inter-field method, such that the first pattern is transferred to each field 306 through the lens 120 by a step-and-repeat process.

Figure 4:
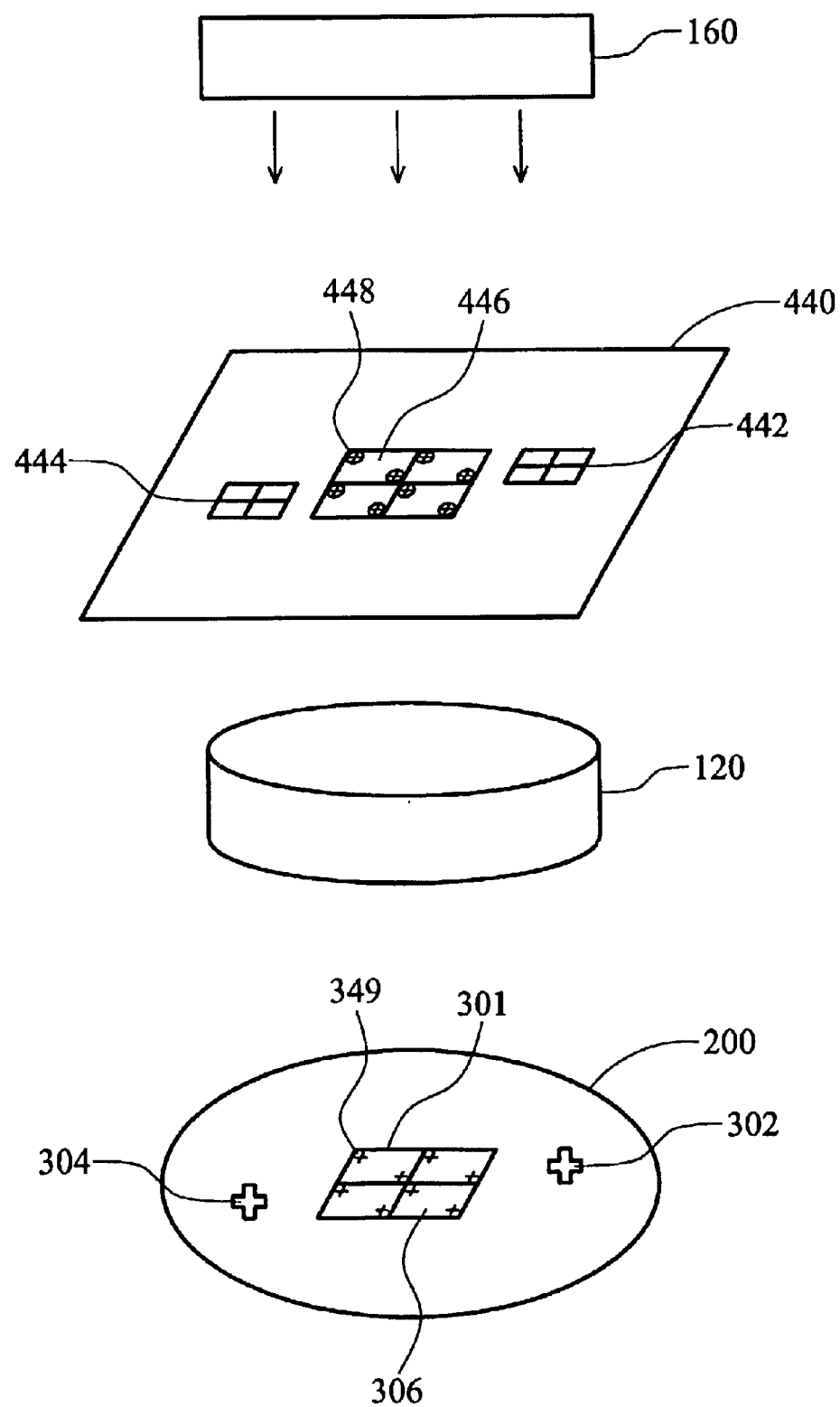
FIG. 4 shows another schematic diagram of the present invention.

As shown in FIG. 4, a subsequent mask 440 is globally aligned with the wafer 200, and then a second pattern 446 on the subsequent mask 440 is transferred to each field 306 by aligning the secondary alignment marks 349 at the corner of each field 306 with the original alignment marks 448 of the subsequent mask 440.

In this case, two global alignment marks 442 and 444 were deposited on the subsequent mask 440 previously. The global alignment marks 442 and 444 are globally aligned with alignment marks 302 and 304 on the wafer 200 by a He—Ne Laser. Next, a plurality of secondary alignment marks 349 at the corner of the fields 306 on the wafer 200 are aligned with the original alignment marks on the subsequent mask 440 by the optical stepper. Then, the second pattern 446 on the subsequent mask 440 is transferred to each field 306.

Therefore, in the present invention, the secondary alignment marks are deposited at the corner of the field on the wafer such that the masks can be aligned with the secondary alignment marks and transfer the patterns to each field on the wafer accurately when the field is complete square. As the alignment marks are formed in side the scribe lines, the alignment marks will always be complete when the field itself is complete.

Furthermore, after all of the fields on the wafer are detached by a wafer saw, the alignment marks at the corner of each field also can be used for alignment in the subsequent process, for example, bonding wire in the packing process.

Finally, while the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A method of aligning a wafer and masks, comprising:

providing a wafer having a surface with a plurality of fields and scribe lines;

providing a initial mask and a subsequent mask having a first pattern and a second pattern respectively corresponding to the fields, the initial mask and the subsequent mask having a plurality of original alignment marks respectively at corner thereof corresponding to the fields;

transferring the first pattern to the plurality of fields, and forming a plurality of secondary alignment marks in the each field corresponding to the original alignment marks by the initial mask; and performing intra-field alignment by aligning the original alignment marks of the subsequent mask with the secondary alignment marks at the corner of each field to form the second pattern on the field.

2. The method as claimed in claim 1, wherein the initial mask and the subsequent mask further each have two global alignment marks thereon.

3. The method as claimed in claim 2, wherein the wafer further has two corresponding marks corresponding to the global alignment marks for global alignment.

4. The method as claimed in claim 1, wherein the original alignment marks are aligned with the original masks of the subsequent mask by a He—Ne Laser of an exposure system.

5. A method of aligning a wafer and masks, comprising:

providing a wafer having a surface with a plurality of fields and scribe lines;

providing an initial mask and a subsequent mask having a first pattern and a second pattern respectively corresponding to the fields, the initial mask and the subsequent mask having a plurality of original alignment marks respectively at corner thereof corresponding to the fields, and have a set global alignment marks respectively thereon;

performing a global alignment by a He—Ne Laser of a exposure system;

transferring the first pattern to the plurality of fields, and forming a plurality of secondary alignment marks in each field corresponding to the original alignment by the initial mask;

performing a global alignment by the He—Ne Laser; and performing intra-field alignment by aligning the original alignment marks of the subsequent mask with the secondary alignment marks at the corner of each field to form the second pattern on the each field.

6. The method as claimed in claim 5, wherein the wafer further has two predetermined marks corresponding to the global alignment marks for global alignment.

* * * * *